United States Patent [19]

Evans, Jr. et al.

[11] Patent Number: 5,121,870
[45] Date of Patent: Jun. 16, 1992

[54] METHOD FOR REDUCING TIME TO PLACE A TOOL ONTO A WORKPIECE

[75] Inventors: Daniel D. Evans, Jr., Oceanside; Dale W. Cawelti, Carlsbad; John B. Gabaldon, San Diego, all of Calif.

[73] Assignee: Hughes Aircraft Company, Los Angeles, Calif.

[21] Appl. No.: 692,884

[22] Filed: Apr. 29, 1991

[51] Int. Cl.$^5$ .................................. H01L 21/607
[52] U.S. Cl. .................................. 228/102; 228/103; 228/179
[58] Field of Search ................ 228/4.5, 102, 103, 179

[56] References Cited

U.S. PATENT DOCUMENTS

| | | | |
|---|---|---|---|
| 4,266,710 | 5/1981 | Bilane et al. | 228/8 X |
| 4,598,853 | 7/1986 | Hill | 228/4.5 |
| 4,817,848 | 4/1989 | Gabaldon | 228/102 |
| 5,011,061 | 4/1991 | Funatsu | 228/10 X |

Primary Examiner—Kenneth J. Ramsey
Attorney, Agent, or Firm—Terie Gudmestad; Wanda K. Denson-Low

[57] ABSTRACT

In bonding a number of pads which may have different heights within a predetermined tolerance the bonding tool (28, 24, 14, 10) is moved in slow speed search mode (70) to contact the first pad ($P_1$) and store the height ($H_1$) of the first pad ($P_1$). After a predetermined amount of continued overtravel ($OT_1$) the bond is performed and the tool raised. Operations on other pads may occur at this point. The tool is then moved to a point above the location of the second pad. The tool is moved down to the second pad without a search mode but to a second pad target height ($H_1 + OT_2$) that is the sum of the sensed height of the preceding pad and an overtravel distance. The approach of the tool to the second pad is done at high speed (84,88) and senses and stores the point of contact, or the actual sensed height of the second pad, for use in determining a target height for the high speed approach to the next pad, thereby eliminating the slow speed search required for all pads but the first on a part.

23 Claims, 2 Drawing Sheets

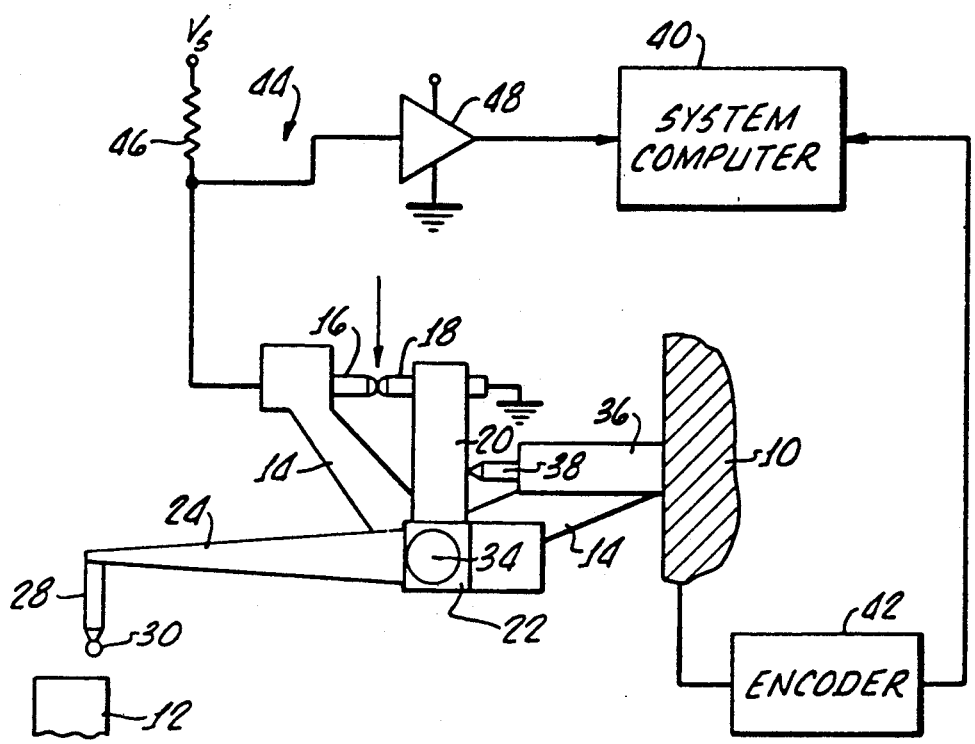
_Fig. 1._
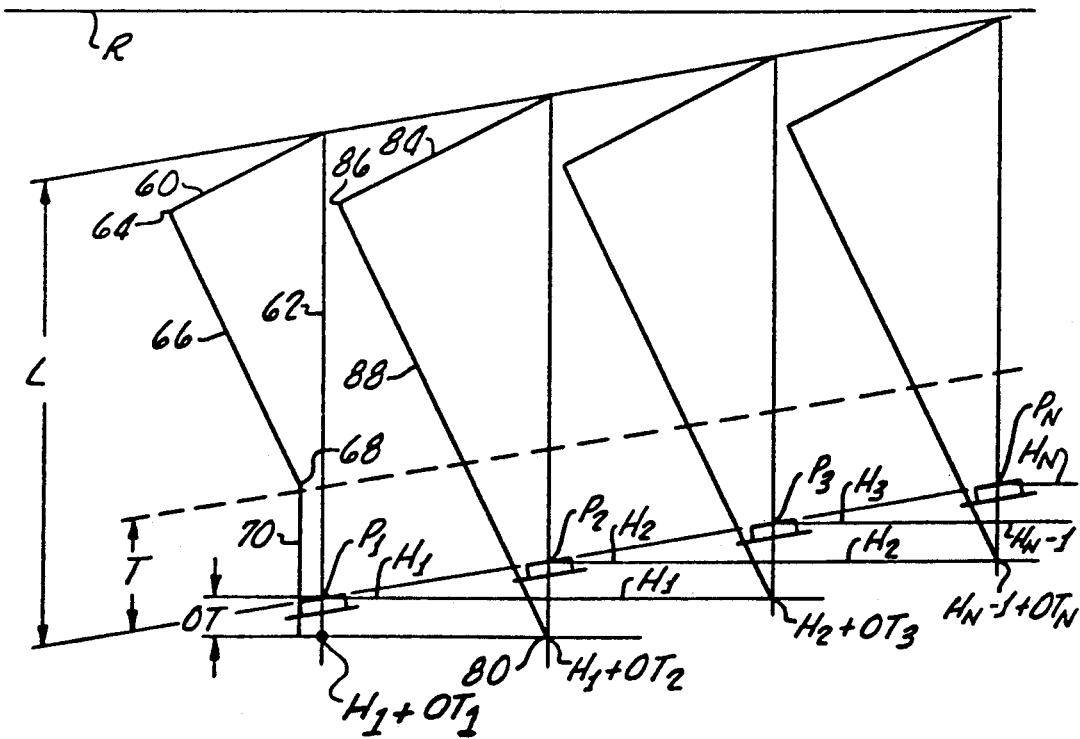
_Fig. 2._

METHOD FOR REDUCING TIME TO PLACE A TOOL ONTO A WORKPIECE

BACKGROUND OF THE INVENTION

1. Field of the Invention

The present invention relates to controlled approach of a tool to a workpiece, and in a specific arrangement concerns a method of reducing the time required to sequentially place a tool onto a plurality of work sites in sequence, when the work site dimensions relative to a reference coordinate system vary by some acceptable tolerance from one work site to another.

2. Description of Related Art

In many types of repetitive sequences a tool is moved to each of a series of work sites on a part to operate on the individual work sites. The operation performed on the work site is usually a fixed short time duration, while the time required to properly and precisely position the tool onto the work site may be a significantly longer time. Thus, the total time of each operation sequence is greatly lengthened because of the time necessary to properly position the tool. This problem is worse where the tool must be precisely positioned with respect to the work site so that a slow speed search mode must be employed in approach of the tool to the work site.

The problem of time of approach of a tool to a work site is of particular importance in various types of automatically controlled bonding operations, including tape automated bonding, wedge bonding, and ball bonding. In such bonding operations it is common to perform operations on a number of closely adjacent work sites or pads, in sequence, by automatic control of a bonding tool. Generally a bonding tool under computer control is mounted on a carriage that moves horizontally in X and Y relative to a work table upon which the part containing the pads to be bonded is mounted. The bonding tool is first positioned directly over the pad to be bonded and then moved downwardly at a rapid rate to a search height, which is a tolerance height above the pad position. This is to ensure that the tool will not contact the pad while the tool is moving at a high velocity. Once at the tolerance height the tool is moved downwardly toward the pad at a very slow, constant search velocity, until contact (touchdown) between the bonding tool and the pad to be bonded is sensed. Motion of the carriage that compliantly mounts the bonding tool is continued, beyond touchdown, through a selected overtravel distance to ensure good contact and application of a predetermined force between the tool and the pad. Because the height of each pad varies from pad to pad, the tool is moved through its tolerance height zone using a slow speed search mode to approach each pad. The search mode is slow and time consuming and thus greatly adds to the time required for performing a plurality of bonding operations.

Accordingly, it is an object of the present invention to provide a method of moving a tool to a workpiece that avoids or minimizes above-mentioned problems.

SUMMARY OF THE INVENTION

In carrying out principles of the present invention in accordance with a preferred embodiment thereof a tool is moved toward a first one of a plurality of work sites or pads in a search mode, during which the first pad height is sensed and saved. The tool then performs its operation on the first pad and is moved to a position above the next pad. The sensed height of the first pad is then used as a target distance to move the tool at a relatively high speed, without a search mode, toward the second pad, or toward an overtravel distance beyond the sensed first pad height, at which target height the operation on the second pad is performed. During motion of the tool to the second pad, the height of the second pad is sensed and stored for use in selecting a target height for motion of the tool toward the third pad. The sensed height of each pad is used to determine the target height for high speed (without a search mode) approach to the next pad. Thus, except for the first pad, no slow speed search is needed or employed, even though pad heights are unknown and may vary from pad to pad within a selected tolerance.

BRIEF DESCRIPTION OF THE DRAWINGS

In the accompanying drawings:

FIG. 1 is a schematic diagram of components of a bonding apparatus useful in explaining the method of the present invention;

FIG. 2 is a diagrammatic illustration showing, to a greatly enlarged scale, geometry of a number of work sites (pads) and velocity profiles of the approach of a bonding tool carriage to several pads.

DETAILED DESCRIPTION OF THE PREFERRED EMBODIMENTS

Figure 3:
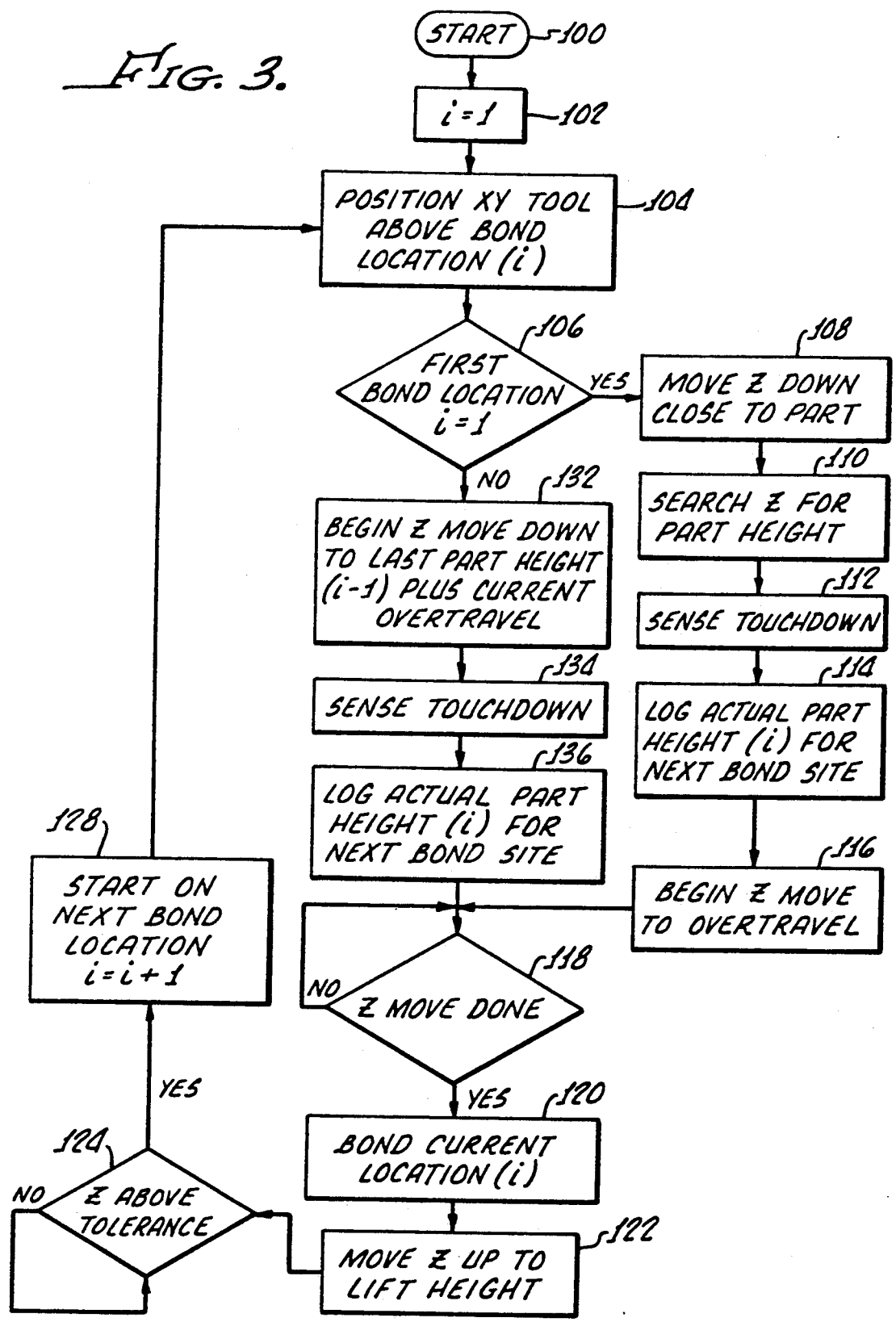
FIG. 3 is a flow chart illustrating steps in the method of control of tool motion.

The present invention is applicable to many different types of tools (other than bonders) and to many different types of bonders. Typical automatic bonders with which the invention is useful include those illustrated in U.S. Pat. No. 4,598,853 of William H. Hill for Open Center Flexural Pivot Wire Bonding Head, U.S. Pat. No. 4,718,591 of William H. Hill for Wire Bonder With Open Center Of Motion, U.S. Pat. No. 4,817,848 of John B. Gabaldon for Compliant Motion Servo, all of which are assigned to the assignee of the present application. Features of such an automatic wire bonder are also shown in a co-pending application, Ser. No. 559,737, filed Jul. 30, 1990, for Electrical Interconnect Integrity Measuring Method of Dale W. Cawelti, Daniel D. Evans, Jr. and John B. Gabaldon, also assigned to the assignee of the present invention.

In general, these bonders embody a bond head carriage 10 (FIG. 1) that is movable vertically (along a Z axis) over a workpiece mounted on a part support 12, which may be carried by a worktable (not shown) that is moveable horizontally under the bonding head along mutually orthogonal X and Y axes. The carriage 10 includes a fixed sensor arm 14 that mounts a fixed touchdown contact 16 for cooperation with a movable touchdown contact 18 carried by a vertical post 20 that is integral with a transducer frame 22. Transducer frame 22 carries an ultrasonic transducer 24, having mounted at its end a capillary like bonding tool 28 adapted to apply a wire ball 30 to target workpieces carried on work support 12. The ultrasonic transducer frame 22, transducer 24 and tool 28, together with the post 20, are compliantly mounted, as a unit, to the carriage on the fixed carriage arm 14 for a small amount of pivotal motion about a horizontal pivot axis 34. A force actuator 36, fixedly carried by the carriage, has a movable piston 38 which contacts fixed post 20, tending the urge the latter in a counterclockwise direction about pivot 34. Thus the bonding tool is compliantly mounted to the carriage for limited vertical motion relative to the carriage to allow a selected amount of overtravel, as will be described below.

The bonding tool and carriage are moved vertically up and down under control of a system computer 40, which controls motion of the carriage according to a program that will be described below and of which a flow chart is illustrated in FIG. 3. Movement of the computer controlled bond head carriage is monitored by a position encoder 42 which supplies a carriage position feedback signal to the computer 40.

Electrically, the moving touchdown contact 18 is grounded, while the fixed touchdown contact 16 connects to a logic circuit 44 including a resistor 46 and the input of an amplifier/logic circuit 48 which provides an output to the computer 40.

To provide a generalized description of operation of the schematically illustrated bonder of FIG. 1, the bond head carriage is moved relative to the workpiece horizontally in X and Y to position the tool 28 directly over the work site or pad to be bonded. This may be accomplished either by motion of the worktable upon which the workpiece is mounted or by horizontal motion of the bonder. Then the bonding tool is moved downwardly to a bonding position on the workpiece. To this end the carriage is moved downwardly while the compliantly mounted transducer 24, bonding tool 28 and post 20 are resiliently urged in a counterclockwise direction (as viewed in FIG. 1) by force actuator 36, 38 to ensure contact between fixed touchdown contact 16 and movable contact 18. The carriage is moved downwardly until the tip of the bonding tool contacts the workpiece, at which time the tool and transducer start to pivot about axis 34 in a clockwise direction relative to the carriage fixed arm 14, to thereby break the contact between the contact elements 16 and 18. This sends a touchdown signal to the computer, signifying that the tip of the bonding tool 18 has contacted the workpiece. The carriage continues through a small preselected amount of overtravel distance, with the tip of the bonding tool remaining fixedly in contact with the workpiece, thereby causing the bonding tool transducer and fixed arm 20 to pivot further, by a small amount, in a clockwise direction against the force exerted by actuator 36 and its piston 38. A further description of this sequence of operations is found in the above-identified U.S. Patents and U.S. patent application, the disclosures of which are incorporated by this reference as though fully set forth herein.

A predetermined amount of overtravel beyond the touchdown is desired to assure that a predetermined amount of force will be exerted by the tool upon the workpiece as the bonding operation is performed. Thus a selected amount of carriage overtravel (permitted because of compliant mounting of the tool to the carriage) after sensed touchdown is programmed into the motion. When automatically performing a large number of computer controlled bonds it is desirable to move the bonding tool down to the workpiece as rapidly as possible. However, this cannot be done when the height of the work sites or pad is unknown, that is, when pad height varies within a predetermined tolerance. Therefore it is common practice, before the present invention, to move the bonding tool downwardly to a target position, e.g. a target search height, that is a small distance above a nominal height of the pad to be bonded. This motion to the target height is carried out rapidly, as can be seen in FIG. 2, with respect to the pad indicated at P1.

FIG. 2 illustrates two dimensional geometry of bonding tool motion with respect to a plurality of pads generally indicated at $P_1$, $P_2$, $P_3$ and $P_n$. In this figure the several pads which are on a common substrate or die are shown to have a varying height or distance from a reference, generally indicated at R. Nominally and ideally the pads would be all at the same precise predetermined height or distance below the reference R. However, in actuality, the pad heights vary within a selected tolerance T so that the difference in height from pad to pad may be as much as the tolerance distance T, although, as can be seen in the figure, the total variation in height from the first pad to a subsequent pad may be greater than the tolerance T. This figure shows, only as an example, linear variation of height from pad to pad. It will be understood that principles of the present invention are equally applicable to other types of pad to pad variations, provided only that such pad to pad variation is within a known tolerance.

After making any one bond, the carriage and bonding tool are lifted from the pad by a distance equal to a predetermined lift distance L, indicated in FIG. 2, in order to be sure that the subsequent lateral motion of the bonding head relative to the pad to position the bonding tool over the next pad to be bonded will not interfere with any other pad that may be higher (within the allowed tolerance) than the pad just bonded. Thus for each pad the bonding carriage is moved to the lift height L and moves to the pad with a programmed velocity profile.

This velocity profile, for the first pad, is illustrated in FIG. 2 as having three sections. In the illustrated profiles distance along vertical line 62 represents distance of the carriage from the pad, while distance to the left of line 62 represents magnitude of carriage velocity in its descent toward the pad. A first section of the first pad velocity profile, indicated at 60, represents an increase of velocity to a maximum velocity 64 of the velocity profile, at which time the tool velocity begins to decrease, as indicated at velocity profile leg 66, until the carriage attains its initial target height, which is a search height, indicated at 68. The target search height 68 may be a small distance, typically 0.008 inches and is usually at the maximum tolerance height of the target pad surface. The carriage has been moved rapidly to this target height, but slows its speed before the tool might contact the pad. When target height 68 is reached by the carriage, the third leg 70 of the velocity profile begins. This is a relatively slow, constant search velocity, continuing the same downward motion of the carriage and tool, but at a much lesser rate, until touchdown occurs. The constant search velocity of the carriage carries the bonding tool 28 slowly downwardly from its search height until its lower tip contacts the workpiece. Just prior to the moment of contact, the two contacts 16, 18 are in electrical contact with one another, being held together by the operation of the force actuator 36, 38. The point of touchdown then is signalled by the breaking of the circuit between the two contacts, and the programmed amount of carriage overtravel indicated in FIG. 2 as $OT_1$ begins. During the carriage overtravel, of course, the bonding tool 28 remains in position, in contact with the pad, while the carriage continues downwardly, to further pivot the ultrasonic transducer and bonding tool in a clockwise direction while applying the programmed force to the bonding tool through actuator 36. When the overtravel distance has been reached, vertical motion stops (all horizontal motion has stopped before the tool reaches search height), and the ultrasonic transducer is energized to accomplish the bonding operation. Upon completion of the bonding, the carriage is moved vertically through the lift distance L to ensure clearing of the adjacent pads as the tool moves laterally to the next adjacent pad.

The above-described operation of the motion of the bonding tool is used only for first pad $P_1$ in the system to be disclosed herein. However, this first pad motion is an operation commonly carried out at present by prior art systems for all pads to be bonded. Thus, according to prior art, the approach of the bonding tool to each pad individually will include the time consuming, slow constant speed search leg of its velocity profile as indicated with respect to the pad $P_1$. Typically, one part has many bonding (work) sites. In our embodiments, the first site at each part is measured. Each other site is then moved to without searching for its height.

In accordance with the present invention, however, the time consuming, slow speed search leg of the velocity profile is eliminated for approach of the bonding tool to all of the pads being bonded, excepting only the first pad. Thus, in general, approach to the first pad is as described in connection with pad $P_1$, utilizing the three section velocity profile 60, 66 and 70, which includes the constant slow speed search leg 70. However, for approach of the bonding tool to a second pad, $P_2$, a target height is established at a height (e.g. distance from reference R), such as indicated at point 80, that is equal to the sensed target height $H_1$ of the previous (first) pad $P_1$, plus a selected overtravel distance $OT_2$ for the second pad. Generally, but not always, the selected overtravel for all of the pads will be the same. Thus, to approach the second pad, $P_2$, the carriage is programmed to move through a two component velocity profile, including a first velocity profile leg 84. During this leg 84 the downward velocity of the carriage ramps up to a maximum speed at a point 86 and then follows a second, decreasing velocity leg 88 which attains zero velocity, that is, stops the carriage, at point 80. Note that the maximum speed 86 attained during approach to the second and subsequent pads may be, and preferably is, greater than the maximum speed attained during approach to the first pad, because no search mode is needed, and the carriage has a longer distance to travel to its target height.

Although a linearly decreasing velocity profile leg 88 is illustrated, it will be readily understood that the velocity profile 84, 88 may have any selected variation provided that it requires an acceptably minimized time for approach of the tool to the pad from the lift point to the target height $H_1+OT_2$, at which point the carriage stops.

Thus, in moving to the bonding position at the second pad, the bonding tool moves with its most rapid velocity profile, without any slow search mode, to and through the touchdown, to the target height $H_1+OT_2$. At touchdown the height $H_1$ of the second pad $P_1$ is sensed and stored for use in the approach to the next bonding pad. In other words, for approach to the second pad the carriage is programmed to move directly to the target height $H_1+OT_2$. Use of the selected overtravel distance ensures that the tool is pressed against the workpiece with the predetermined force applied by the force actuator 36.

After the bonding operation at pad $P_2$ has been accomplished, the carriage is raised through the lift distance, and, as soon as the lift tolerance distance has been attained, lateral motion is commanded to move the bonding tool precisely over the third pad $P_3$. Lift tolerance may be just when the touch contacts 16, 18 close and tool 28 lifts off pad. Again there is established, with respect to pad $P_3$, a target height that is equal to the sum of the height $H_2$ of the immediately previous pad $P_2$ plus the selected overtravel distance $OT_3$ for pad $P_3$. The carriage is then moved downwardly with a maximized velocity profile, to minimize the approach time of the tool to this new target height $H_2+OT_3$. Again the height $H_3$ of this pad $P_3$ is sensed and stored. This sensing and storing of the height of a preceding pad and then using that stored height to establish a target height for the rapid approach to the succeeding pad is continued until all bonds have been accomplished. The slow, time consuming search mode is carried out only for the first pad, so that the overall time of bonding a plurality of such pads is improved by approximately ten to sixty percent.

The above described steps are carried out by the computer 40 which is programmed to accomplish the described motions. A flow chart of a preferred embodiment of such a program is illustrated in FIG. 3, wherein block 100 indicates a start and block 102 represents the initialization of the "i" or bond location counter to "one". The tool is then moved laterally in X and Y relative to the workpiece to position the tool directly above the bond location "i" as indicated in block 104. The count of the counter is then interrogated, block 106, to determine whether or not this location is the first location or a subsequent location. If this is the first location and the count of the location counter is equal to one, the tool is then moved down to a predetermined search height, as indicated in block 108. Upon attainment of the search height the slow constant speed search is started, block 110, and upon contact of the tool with the work site or pad, touchdown is sensed, block 112. Upon sensing touchdown the actual height of the carriage at touchdown is stored or logged for use at the next bond site, block 114. Now the carriage begins to move downwardly through its selected overtravel distance, block 116. The position of the carriage is then monitored to determine whether or not the carriage has moved through the predetermined amount of overtravel, as indicated in block 118. The carriage continues to move downwardly until this interrogation signals that selected overtravel amount has been reached, at which time carriage motion stops and the bonding operation is initiated, as indicated at block 120, to bond the pad $P_1$ which is the first pad. Upon completion of the bond the carriage begins to move upwardly toward the lift height, as indicated in block 122, while the height of the carriage is interrogated, as indicated in block 124, to determine whether or not the carriage has risen above the tolerance height. The carriage continues to rise until this interrogation indicates that the carriage has exceeded the tolerance height, at which time the location counter is augmented, as indicated in block 128, and lateral motion toward the next pad location may begin. Thus the carriage may continue its vertically upward motion with no horizontal motion permitted until it reaches the tolerance level. Only after rising above the tolerance level, the carriage may begin to move laterally toward the next pad location while continuing to move vertically to lift height.

A first loop has been completed and the program returns to block 104 to position the tool above the next bond location. Interrogation of the location counter indicates that this second location is not the first, and then the carriage is commanded to begin its downward (Z axis) motion as indicated in block 132. Note that after sensing and storing the height H of the first pad, a target height for the second pad is established at a height equal to $H_1+OT_2$. Thus in block 132 the carriage motion is begun to move the carriage to this precalculated target height, $H_1+OT_2$. As the carriage moves at high speed downwardly toward the second pad and the tool first contacts the pad, touchdown is sensed and signalled as indicated at block 134. Upon signalling of touchdown the actual pad height $H_2$ of the second pad is stored as indicated in block 136. The carriage continues its downward motion toward the target height $H_1+OT_2$ and when the selected target position height has been attained, as indicated in block 118, the tool is in proper position and bonding at the second pad may begin.

It will be seen that the described method significantly reduces the time required to sequentially place a tool onto a plurality of different pads where the pad dimensions relative to a reference vary within an acceptable tolerance from one pad to the next. According to the method described herein the tool need search for the pad height only for the first work position, whereas at all subsequent work positions the tool is commanded to move directly to the pad height measured at the previous work position plus a specified overtravel. It may be noted that the overtravel amount must be greater than the negative side quantity of the allowable dimensional variation from pad position to pad position in order to ensure that the tool will contact the pad.

Because the slow constant speed search velocity mode has been eliminated and the tool and carriage may be commanded to move directly to the selected target height, the carriage may be commanded to attain a higher maximum velocity during its approach to all pads subsequent to the first pad. Therefore the time advantage attained by the described method includes both the elimination of the time consuming slow speed search mode and the ability to employ a higher maximum velocity of the carriage during approach to all pads after the first.

We claim:

1. For use with an apparatus wherein a tool successively operates on a number of different pads at adjacent locations, and wherein the distances, H, of each pad relative to a reference in a predetermined direction of approach of the tool toward the pad may vary from pad to pad, the tool being moved to the pad in said predetermined direction, a method for decreasing time required to move the tool, said method comprising the steps of:
    laterally positioning the tool at the location of a first pad to be operated on by the tool,
    moving the tool toward said first pad in a first velocity mode to contact the pad and sense the distance $H_1$, of the first pad,
    storing the distance $H_1$,
    causing the tool to operate upon said first pad,
    moving the tool form said first pad,
    laterally moving the tool to the location of a second pad,
    moving the tool in a second velocity mode toward the second pad, wherein said second velocity is calculated from the stored distance $H_1$ of the first pad,
    sensing the distance $H_2$ of the second pad,
    storing the distance $H_2$ of the second pad, and
    causing the tool to operate on the second pad.

2. The method of claim 1 wherein the tool is mounted on a carriage, and including the step of moving the carriage through an amount of over travel beyond each pad.

3. The method of claim 1 wherein said second velocity mode provides an approach time less than the approach time provided by said first velocity mode.

4. The method of claim 1 wherein said first velocity mode includes a slow speed search mode providing a relatively long approach time, and wherein said second velocity mode provides a relatively short approach time to a target height equal to the stored distance $H_1$ plus an overtravel distance.

5. The method of claim 1 wherein said step of moving the tool in a first velocity mode comprises moving the tool toward the first pad at a relatively low constant speed search velocity, and wherein said step of moving the tool in a second velocity mode comprises moving the tool to said second pad without a search velocity.

6. The method of claim 1 wherein said step of moving the tool in a first velocity mode comprises searching for said first pad at a constant slow tool velocity, and eliminating searching for said second pad.

7. The method of claim 6 wherein said step of searching for said first pad comprises moving the tool toward the first pad at a relatively rapid rate to attain a search position and then moving the tool at a relatively slow rate during said step of searching, ad wherein said step of moving the tool toward said second pad comprises moving the tool at a relatively rapid continuously decreasing rate without a search step.

8. The method of claim 1 wherein said second velocity mode provides a minimum time to move the tool to said distance $H_1$.

9. The method of claim 1 wherein said step of moving the tool in a second velocity mode comprises moving the tool in a velocity mode that continuously decreases until the tool reaches zero velocity at a target distance $H_1$ plus an overtravel distance.

10. The method of claim wherein said tool is mounted on a carriage, and wherein said step of moving the tool toward said second pad at said first pad distance $H_1$ includes moving said carriage to a distance that is the sum of said first pad distance H and an over travel distance.

11. A method for decreasing the time to place a bonding tool onto a pad wherein the bonding tool is compliantly mounted on a carriage and is arranged to perform a bonding operation on each of a plurality of adjacent pads of which the pad height with respect to a reference varies within a predetermined tolerance, said method comprising the steps of:
    positioning the carriage and tool laterally at a first location above a first one of said pads,
    moving the carriage and tool downwardly toward the pad to a first pad target height that is a search position above the pad,
    moving the carriage and tool from said search position to said first pad at a relatively slow velocity to contact the first pad and sense the height $H_1$ of the first pad,
    storing said height $H_1$,
    moving the carriage and tool downwardly from the point of contact with the first pad through an over travel distance, performing a bond at said first pad, raising and moving the carriage and tool laterally to said second location above a second pad, moving the carriage and tool downwardly toward a second pad and directly to a second pad target height that is the sum of said first pad height $H_1$ and an over travel distance, sensing and storing the height $H_2$ of said second pad, and causing said tool to bond said second pad.

12. The method of claim 11 wherein said step of moving the carriage and tool toward said second pad comprises moving the carriage and tool with a smooth velocity profile which comprises a continuously decreasing velocity that attains a zero value at a target height equal to the sum of said first pad height $H_1$ and an overtravel distance.

13. The method of claim 12 including the step of moving the carriage and tool toward a third pad to a third pad target height that is the sum of said second pad height $H_2$ and an overtravel distance.

14. A method of moving a bonding tool successively to each of a plurality of pads $P_i$, having variable heights $H_i$ with respect to a reference, comprising the steps of:

positioning the tool over a first one of the pads $P_1$, moving the tool in a search mode to sense height $H_1$ of the first pad $P_1$, storing the height $H_1$ of the first pad $P_1$, bonding the first pad $P_1$, moving the bonding tool to successive ones $P_i$ of said pads to perform a bonding operation at each of said pads by moving the tool toward each successive pad $P_i$ at the height $H_{i-1}$ of the preceding pad $P_{i-1}$ at a subsequent velocity $V_i$ wherein each subsequent velocity $V_i$ is calculated from the previously stored height $H_{i-1}$, and sensing and storing the height $H_i$ of each pad $P_i$.

15. The method of claim 14 wherein said step of moving the tool to each successive pad $P_i$ comprises moving the tool directly to said height $H_{i-1}$.

16. The method of claim 14 wherein said step of moving the tool to each successive pad $P_i$ comprises moving the tool to the height of the preceding pad without a search mode.

17. The method of claim 14 wherein the tool is compliantly mounted on a carriage, and including the step of moving the carriage through an overtravel distance after sensing said height $H_1$ and wherein said step of moving the tool to each successive pad comprises moving the carriage with a continuous velocity calculated form a target height comprising the sum of said height $H_{i-1}$ of he preceding pad $P_{i-1}$ and an overtravel distance.

18. A method of moving a tool in an approach direction to each of a plurality of pads in sequence where the distances of said pads from a reference in said approach direction vary from pad to pad, said method comprising the steps of:

moving the tool toward a first one of said pads, searching for and storing the distance $H_1$ of said first pad from said reference, causing the tool to perform an operation at said first pad, moving the tool away from said first pad, establishing said distance $H_1$ as a target distance for a second one of said pads, moving said tool toward said target distance $H_1$ at said second pad with a linearly decreasing velocity calculated from said distance $H_1$, sensing and storing the distance $H_2$ of said second pad from said reference, and causing the tool to perform an operation at said second pad.

19. The method of claim 18 wherein said tool is movably mounted on a carriage and wherein said step of searching comprises moving said carriage and tool in a search mode unit said tool contacts said first pad, and moving said carriage through a selected first pad overtravel distance $OT_1$ after said tool contacts said first pad.

20. The method of claim 18 wherein said tool is movably mounted on a carriage and wherein said step of moving said tool to said target distance $H_1$ at said second pad comprises moving said carriage to a point beyond said target distance $H_1$ by a pad overtravel distance $OT_2$.

21. The method of claim 18 wherein said tool is compliantly mounted on a carriage and wherein said first mentioned step of storing comprises generating a touchdown signal upon contact of said tool and said pad and storing said distance $H_1$ as a function of the position of said carriage when said contact occurs.

22. The method of claim 18 wherein said tool is a bonding tool compliantly mounted on a vertically moving carriage and adapted o perform a bonding operation on each of said pads, one at a time, said step of searching for and storing comprising moving the carriage downwardly toward said first pad in a search mode until said tool contacts said first pad, storing a signal representing said distance $H_1$ upon contact of said tool with said first pad, continuing to move said carriage through a first pad overtravel distance, said step of moving said tool to said target distance $H_1$ at said second pad comprising moving the carriage in a continuous linearly decreasing velocity high speed mode to a point beyond said target distance $H_1$ by a second pad overtravel distance, thereby causing said tool to contact said second pad, said step of sensing the storing the distance $H_2$ comprising storing a signal representing sad distance $H_2$ upon contact of said tool with said second pad.

23. The method of claim 18 including the step of moving said tool upwardly, away from said first pad after said tool is caused to perform an operation at said first pad, and including the step of starting to move said tool laterally toward said second pad as soon as said tool is moved away from said first pad by a tolerance distance.

* * * * *